(12) United States Patent
Armbrüster

(10) Patent No.: US 6,842,516 B1
(45) Date of Patent: Jan. 11, 2005

(54) DIGITAL ADAPTIVE FILTER AND ACOUSTIC ECHO CANCELLER USING THE SAME

(75) Inventor: Werner Armbrüster, Eckenthal-Forth (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/353,484

(22) Filed: Jul. 13, 1999

(30) Foreign Application Priority Data

Jul. 13, 1998 (DE) ......................................... 198 31 320

(51) Int. Cl.[7] .............................. H04M 1/00; H04M 9/00
(52) U.S. Cl. .............................. 379/390.02; 379/395.01; 379/388.01; 379/388.02; 379/406.01; 379/406.08
(58) Field of Search ....................... 379/406.01–406.16, 379/387.01–390.04, 395–395.07

(56) References Cited

U.S. PATENT DOCUMENTS

| | | | | |
|---|---|---|---|---|
| 5,272,695 A | * | 12/1993 | Makino et al. | 370/291 |
| 5,386,472 A | * | 1/1995 | Pfaff et al. | 381/71.12 |
| 5,416,845 A | * | 5/1995 | Qun | |
| 5,721,772 A | * | 2/1998 | Haneda et al. | |
| 5,721,782 A | * | 2/1998 | Piket et al. | |
| 5,876,350 A | * | 3/1999 | Lo et al. | 600/519 |
| 5,953,380 A | * | 9/1999 | Ikeda | 375/346 |
| 6,122,609 A | * | 9/2000 | Scalart et al. | |
| 6,434,110 B1 | * | 8/2002 | Hemkumar | |

* cited by examiner

*Primary Examiner*—Duc Nguyen

(57) ABSTRACT

To achieve an improved convergence behaviour for, e.g., echo cancellation there is provided a digital adaptive filter which includes a filter coefficient update means to successively update filter coefficients in accordance with an input signal, an estimated power of the input signal, and an error signal between the input signal filtered in the digital adaptive filter and the input signal propagated along an external path being modelled by the digital adaptive filter. Here, an input signal power estimation means is adapted to perform recursive smoothing for an increasing input power and a decreasing input power in an asymmetric fashion with different smoothing factors. In case the estimation is carried out in the frequency domain the step size for the update of filter coefficients may be calculated for each frequency band individually.

17 Claims, 11 Drawing Sheets

DIGITAL ADAPTIVE FILTER AND ACOUSTIC ECHO CANCELLER USING THE SAME

FIELD OF INVENTION

The present invention relates to a digital adaptive filter and to an acoustic echo canceller using the same.

In particular, the present invention relates to a digital adaptive filter where the adaptation process is carried out on the basis of the normalized least mean square error algorithm NLMS of an error signal.

BACKGROUND OF INVENTION

The growing demand of communication systems, in particular of the hands-free type has led to an increased effort in developing acoustic echo cancellers. Such acoustic echo cancellers require efficient filtering techniques with low computational burden and delay.

As is commonly known, the use of, e.g., a handset in a vehicle during driving significantly reduces the attention of the driver and increases the risk of accidents. Here, hands-free equipment allows the driver to concentrate more on the traffic and increases security. One reason that hands-free equipment is not widely used is due to the poor quality of available systems. Another reason is that available hands-free equipment usually work on a switching basis thus requiring a high talking discipline by both users as only half duplex communication is possible.

An approach towards full duplex communication can be achieved by acoustic echo cancellation where the echo is not suppressed but compensated, as described, e.g., in "On the Implementation of a Partitioned Block Frequency Domain Adaptive Filter (PBFDAF) for Long Acoustic Echo Cancellation", José M. P. Borrallo, Mariano G. Otero, Signal Processing 27 (1992), pp. 309–315.

FIG. 1 shows the related fundamentals of echo cancellation. In particular, FIG. 1 shows a loudspeaker 200 and a microphone 202 of, e.g., a hands-free communication device or a teleconference system. Further, an echo propagation path 206 is shown in dotted lines between the loudspeaker 200 and the microphone 202. Usually, a near end speaker of the communication device receives acoustic information via the loudspeaker 200 and transmits information to a far end speaker via the microphone 202. However, it is through the feedback propagation of sound waves outputted by the loudspeaker 200 that echoes are back propagated to the far end speaker.

As shown in FIG. 1, to overcome this drawback an adaptive filter 208 may be used to generate a synthetic echo for antiphase compensation with the real echo. In other words, the adaptive filter 208 is a model of the echo path 206 and has to adapt to changing real world environments due to, e.g., movement of the near end speaker or changing of the environment where the hands-free communication device is installed.

As also shown in FIG. 1, to carry out the antiphase w compensation, there is provided a summation point 210 where the real echo and the synthetic echo are subtracted. However, as the adaptive filter 208 will usually not achieve a complete modelling of the real world environment after summation, there will remain an error signal that may then be back propagated to the far end speaker.

The adaptive filter 208 may be implemented as a time domain or a frequency domain adaptive filter. Further, the filter has to be adaptive to adjust to different room environments and to the movements of the near end talker. The process of adjusting the filter coefficients is called convergence and the speed of convergence defines to a large extent the performance of the acoustic echo canceller.

The adjusting of filter coefficients relies on the input signal to the adaptive filter, an estimation of the power of this input signal and finally on the error signal between the input signal filtered in the adaptive filter and the signal received through the microphone 202, i.e. the pathy 206 modeled through the adaptive filter.

FIG. 2 shows a signal flowgraph for the estimation of the power of the input signal. Here, the instantaneous power of the input signal is derived and then weighted with a factor $\beta$ in a first multiplier 214. To also execute a corrector step the estimated power level is rated by a factor $(1-\beta)$ through a second multiplier 216, delayed in a delay unit 218 and finally added to the instantaneous power through an adder 220, as shown in FIG. 2.

However, the approach to power level estimation shown in FIG. 2 does not take into account any information on the input signal but uses only predefined factors irrespective of the signal characteristics. Still further, any prevailing surrounding conditions have no impact on the estimation of the power level, e.g., such as surrounding noise. Therefore, the usual approach illustrated in FIG. 2 achieves only a limited convergence behaviour of the adaptive filter with the related negative impact on the communication quality.

SUMMARY OF INVENTION

In view of the above, the object of the invention is to provide a digital adaptive filter with enhanced convergence speed also under background noise.

According to a first aspect of the present invention this object is achieved with a digital adaptive filter, comprising filter coefficient update means to successively update filter coefficients in accordance with an input signal, an estimated power of the input signal, and an error signal between the input signal filtered in the digital adaptive filter and the input signal propagated along an external path being modeled by the digital adaptive filter, and input signal power estimation means adapted to perform recursive smoothing for an increasing input power and/or a decreasing input power asymmetrically.

Here, the choice of two different smoothing factors allows for a faster convergence when compared with a solution using a common factor. Also, a stepsize too large in case of a rapid increase of the input power is prohibited to avoid any instability.

According to a preferred embodiment of the present invention the input signal power estimation means performs the recursive smoothing of the estimated input power with a different weighting factor for an increasing and decreasing input signal power level, respectively.

Therefore, it is possible to take into consideration that usually at the beginning the power level of an input signal starts and increases very sharply and then returns back to a zero level over a much longer time period. Through using a dedicated weighting factor for a sharp increase and slow decrease of the power level it is possible to achieve an overall significantly improved convergence behaviour.

According to a further preferred embodiment of the present invention the digital adaptive filter carries out the estimation of the input signal power level in the frequency domain and calculates a step size for at least one frequency band individually in dependence on the background noise level of the frequency band.

This embodiment of the present invention particularly considers the background noise inside a flat spectrum or in other words that the background noise is not evenly distributed over the frequency range. Through dedicated step size calculations for the single frequency bands it is possible to achieve optimum convergence adapted to the prevailing situation and therefore an overall better performance of an acoustic echo canceller using such a digital adaptive filter.

Also, according to a further preferred embodiment of the present invention the frequency domain adaptive filter has a variable input block length that is not restricted to a power of 2.

Thus, according to the present invention the restriction that the input block length for the frequency domain adaptive filter is selected according to the power of 2 is avoided, therefore increasing the range of possible applications. One example would be GSM speech codec running on a 20 ms basis, i.e. a 160 samples.

According to a second aspect of the present invention this object is achieved through a subband adaptive filter, comprising an analysis filter bank adapted to filter an input signal into at least two frequency bands, a subband filter for each frequency band of the analysis bank to filter the related frequency band output signal, a synthesis filter bank adapted to generate a time domain output signal from the subband filter output signals, wherein each subband filter comprises filter coefficient update means to successively update filter coefficients in accordance with the related frequency band output signal supplied thereto, an estimated power thereof, and a subband error signal between the related frequency band output signal and a corresponding frequency band input signal propagated along an external path being modeled through the subband filter, and wherein the filter coefficient update means is adapted to calculate a step size for each frequency band individually in dependence on the background noise level for each frequency band.

In addition to the advantages outlined above the provision of an adaptive subband filter allows for a flexible scaling between the time domain and frequency domain range. The more frequency bands that considered, the better the convergence behaviour in case of a frequency selective disturbance will be. Still further, the lower the disturbance in a specific frequency band the larger the step size for the filter coefficient update process of the related subband filter may be to achieve a fast convergence.

According to still another preferred embodiment of the present invention there is provided an acoustic echo canceller for a communication device, comprising digital adaptive filter means receiving an input signal of the communication device and generating a synthetic echo to approximate a real echo between a speaker means and a receiving means of the communication device for antiphase compensation and communication monitoring means to detect the current communication status of the communication device and to control the digital adaptive filter means in dependence thereof, wherein the digital adaptive filter means is implemented according to one of the embodiments of the present invention outlined above.

Therefore, the digital adaptive filter according to the present invention is used within an acoustic echo canceller, in particular within a hands-free communication device. Through the improved performance of the inventive adaptive filter the synthetic echos are provided with improved matching to the real echos generated through the echo propagation path between, e.g., a loudspeaker and a microphone of the hands-free communication device.

According to yet another preferred embodiment of the present invention the acoustic echo canceller comprises an estimation means to determine a linear envelope of the input signal energy and a background noise estimation means. Thus, the input signal energy and the background noise may be provided to an activity decision means that distinguishes between different operation states to be handled by the acoustic echo canceller. Based on the estimated input signal energy level and background noise level it is possible to mark an interruption on the background noise and to increase the comfort through the application of the acoustic echo canceller.

BRIEF DESCRIPTION OF DRAWINGS

A better understanding of the present invention may be achieved through the following detailed description of preferred embodiments when taken in conjunction with the accompanying drawings, wherein.

DESCRIPTION OF PREFERRED EMBODIMENTS

Figure 1:
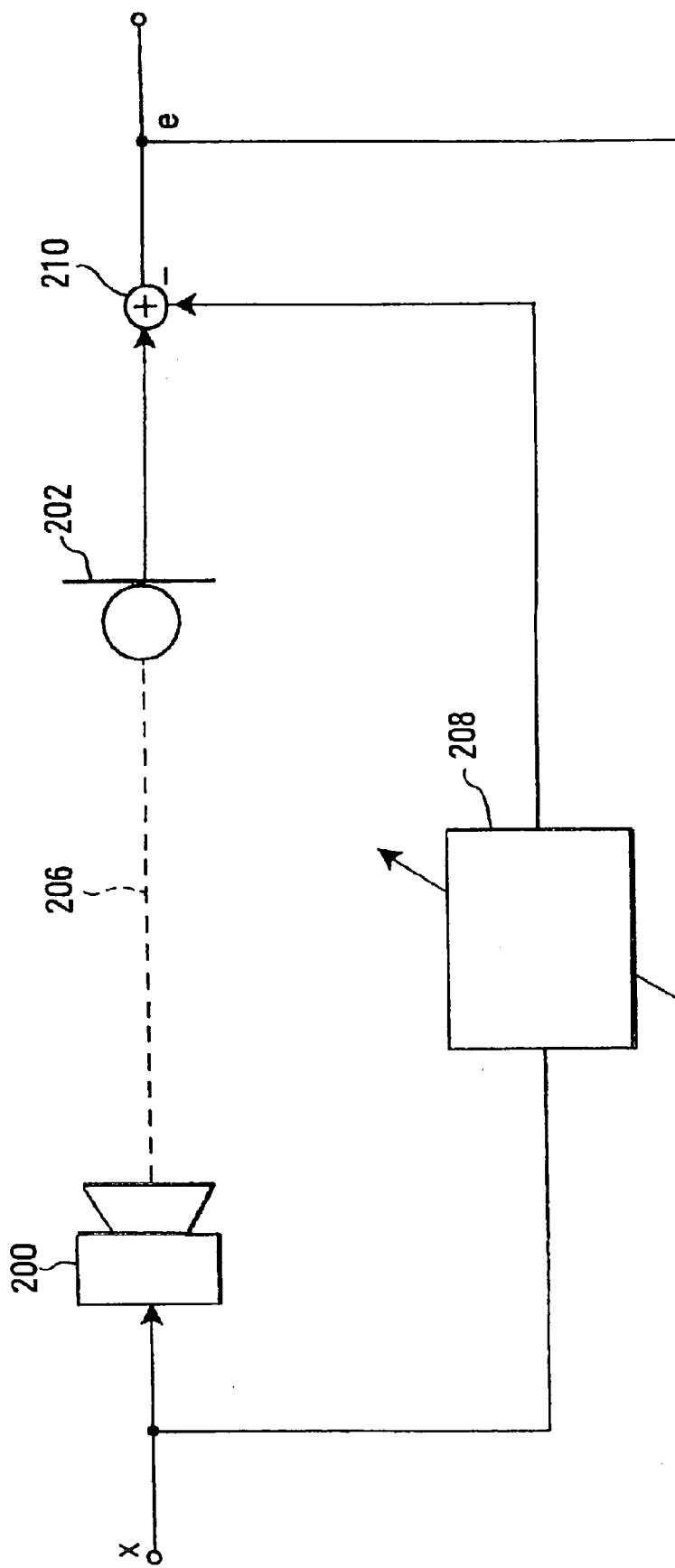
FIG. 1 shows the basic structure underlying the adaptive filtering to cancel for echos propagated between a loudspeaker and a microphone in, e.g., a hands-free communication device.
Figure 2:
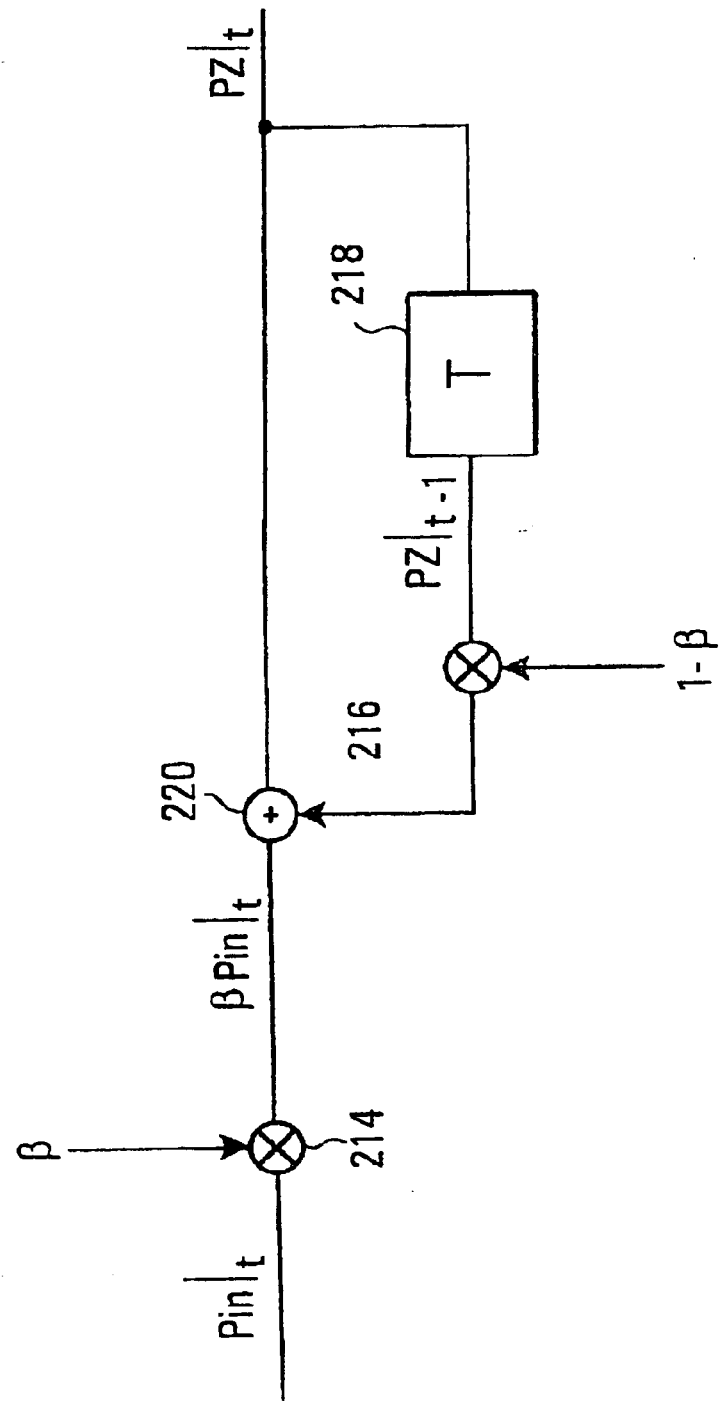
FIG. 2 shows a signal flow diagram for the estimation of a power level of an input signal to the circuit a structure shown in FIG. 1.
Figure 3:
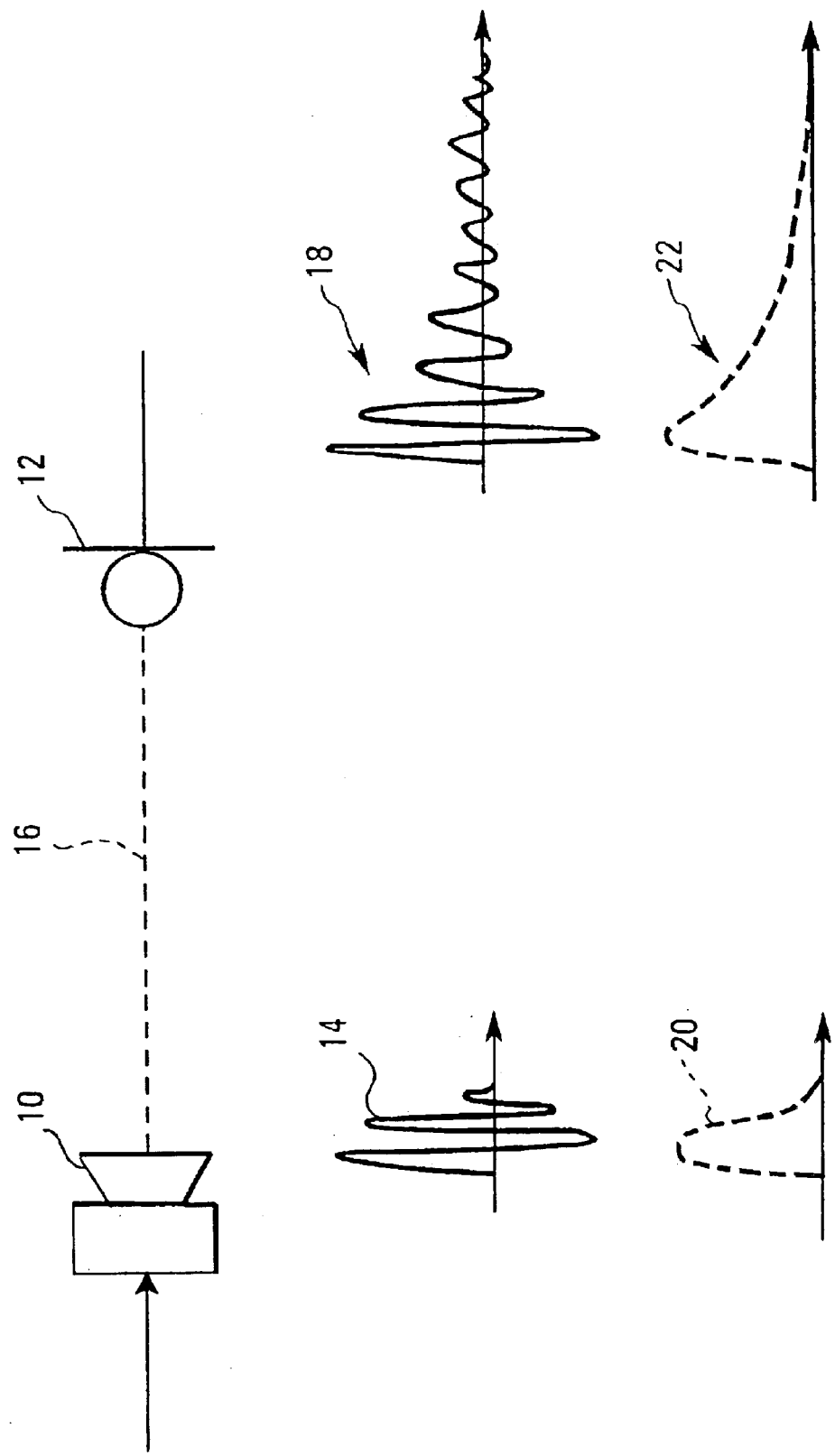
FIG. 3 shows one basic concept underlying the determination of the weighting factor for the power level estimation according to certain aspects of the present invention.

FIG. 3 illustrates one basic concept underlying the different embodiments of the present invention, i.e. the asymmetric estimation of, e.g., an input signal power level. In FIG. 3, only a loudspeaker 10 and a microphone 12 used in, e.g., a hands-free duplex communication device are shown.

FIG. 3 illustrates the transmission behaviour along a path between the loudspeaker 10 and the microphone 12. In case the loudspeaker outputs a short period signal 14 at the propagation along the echo path 16 the related signal received by the microphone 12 will be an echo signal with much longer duration. The same holds true for the envelope 20 of the loudspeaker output signal 14 and the envelope 22 of the echo signal 18.

As shown in FIG. 3, usually the envelope 20 of the loudspeaker signal 14 has approximately the same time duration for the raising and falling of the power level thereof. To the contrary, for the echo signal 18 it should be noted that initially the power level rises significantly at the beginning thereof and thereafter has the tendency to fade out over a much longer time period when compared to the loudspeaker output signal envelope 20. In other words, in estimating the power level of an echo signal in dependence on the loudspeaker output signal it should be taken into account that the rising of the power level is significantly faster than the decreasing thereof. This leads to an increased accuracy for the power level estimation and in consequence to an improved convergence behaviour.

Therefore, according to the present invention a recursive approach to the estimation of a power level is implemented according to $$PI|_t = \beta \cdot Pin|_t = (1-\beta) \sim PI|_{t-1}$$

with a different weighting $$\beta = \begin{cases} \beta_{up} & PI \text{ increasing} \\ \beta_{down} & PI \text{ decreasing} \end{cases}$$

The estimated power $PI|_t$ at time t thus is calculated from the instantaneous power $PI|_{t-1}$ at time t and from the estimated power $PI|_{t-1}$ at time t-1. Further, according to the present invention it is proposed that a higher weighting factor $\beta_{up}$ is used in case of an increasing input power level and a lower weighting factor $\beta_{down}$ is used in case of a decreasing input power level. In other words, according to the present invention the estimation of the input signal power level is carried out in an asymmetric manner.

In the following, it will be shown that this concept may be used either in the time domain or in the frequency domain. In the second case, it is also possible to update the different filter coefficients in a frequency band selective way to achieve an even better convergence behaviour by considering background noise.

According to a first embodiment of the present invention the adaptive digital filter is implemented in the time domain. Therefore, the input power level estimation is implemented according to $$PX|_n = \beta \sim x(n) + (1-\beta) \sim PX|_{n-1}$$

$$\beta = \begin{cases} \beta_{up} & PX \text{ increasing} \\ \beta_{down} & PX \text{ decreasing} \end{cases}$$

As can be seen from the above formula, the power level of the input signal at a new time instant n is estimated from the instantaneous power of the input signal $x(n) \sim x(n)$ and the power level estimated for +previous time point n-1.

Figure 4:
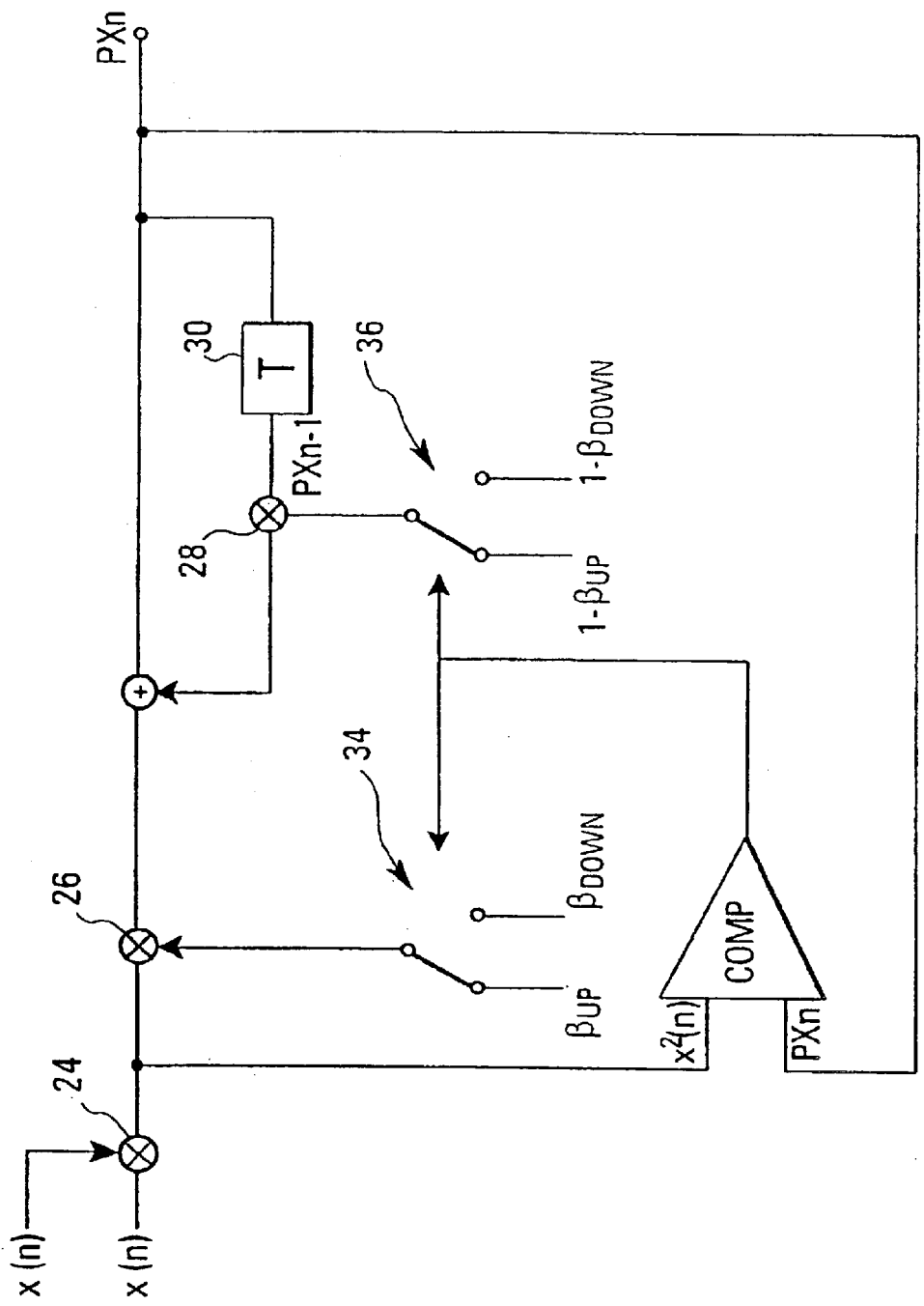
FIG. 4 shows an exemplary schematic diagram of a power level estimation unit with selective weighting factor determination according to the present invention.

FIG. 4 shows a circuit diagram for the time domain implementation for the input signal power level estimation.

Here, a first multiplier 24 is used to derive the instantaneous power $x^2(n)$ of the input signal. This instantaneous power is then selectively multiplied with $\beta_{up}$ and $\beta_{down}$ for an increasing and decreasing input power level in a second multiplier 26, respectively. Then, the power level PX for the previous time point n-1 is added to the output of the second multiplier 26 after being multiplied by $1-\beta_{up}$ and $1-\beta_{down}$ in case of an increasing and decreasing power level, respectively, in a third multiplier 28. This allows derivatives of the new value of the estimated power level.

As also shown in FIG. 4, each estimated power level value is compared to the instantaneous power or output of the first multiplier 24 in a comparator to selectively operate switches 34 and 36 for the correct factors $\beta_{up}$, $\beta_{down}$, $1-\beta_{up}$, $1-\beta_{down}$, respectively. In particular, in case $x^2 > PX$ the comparator 32 will indicate an increasing power level, while to the contrary, in case of $x^2 \leq PX$ the comparator 32 will indicate a decreasing power level.

Therefore, the time domain approach allows for a straightforward implementation of the power level estimation and is therefore a very efficient solution for small filter lengths. One such example of an adaptive digital filter using the asymmetric power level estimation circuit shown in FIG. 4 is illustrated in FIG. 5.

Figure 5:
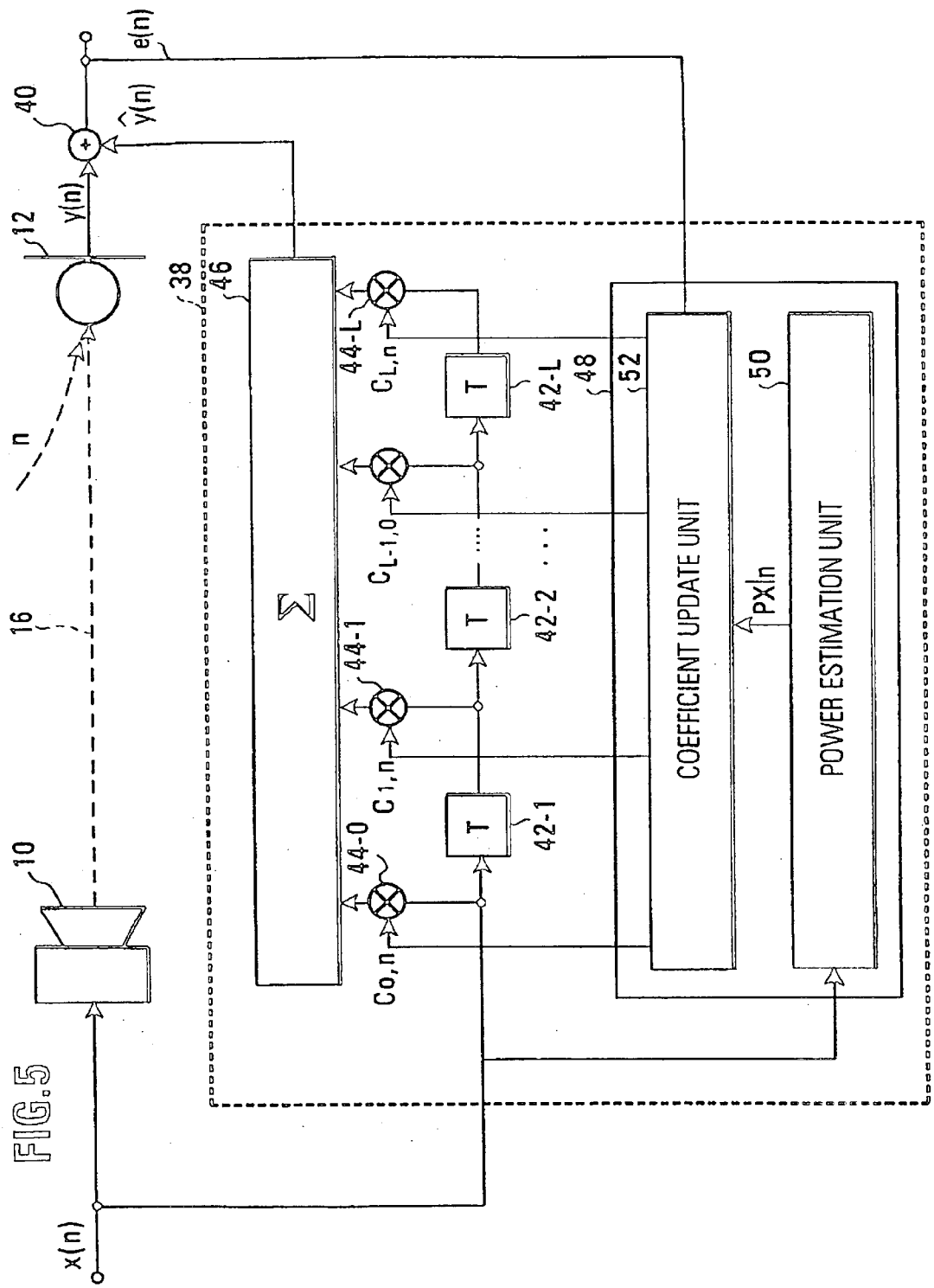
FIG. 5 shows an exemplary time domain implementation of a digital adaptive filter using the asymmetric power level estimation according to the present invention.

As shown in FIG. 5, an input signal x(n) is output by a loudspeaker 10, propagated along an echo path 16 and then picked up through a microphone 12. Further, as outlined above there is provided a time domain adaptive digital filter 38 to model the echo propagation path 16 for the: generation of a synthetic echo for antiphase compensation. Therefore, the output of this time domain adaptive digital filter ŷ(n) is added to the output y(n) of the microphone 12 at a summation point 40. Since the synthesis of the synthetic echo is only an approximation to the real echo there will remain an error signal e(n)=y(n)−ŷ(n) after the summation point 40. Another reason for this is that usually a noise signal n may in addition be picked up through the microphone 12.

As shown in FIG. 5, not only the input signal x(n) but also the error signal e(n)=y(n)−ŷ(n) are input signals to the time domain digital adaptive filter. Also, this filter divides into the usual delay units 42-1, . . . , 42-L, coefficient units 44-0, 44-1, . . . , 44-L and a summation unit 46 to add the outputs of the multiplication units 44-0, . . . , 44-L. To flexibly adapt these coefficients $C_{0,n}$, . . . , $C_{L,n}$ to the propagation conditions between the loudspeaker 10 and the microphone 12 there is also provided an adaptation unit 48 with a power estimation unit 50 and a coefficient update unit 52, respectively.

As shown in FIG. 5, the power estimation unit 50 receives the input signal of the loudspeaker 10 as input signal and derives an estimated power level therefrom using the approach and circuit structure as shown in FIG. 4. Using the estimated power level $PX|_n$ or equivalently $\|x\|$ the update of the filter coefficients $c_n = [C_{0,n}, \ldots, C_{L,n}]^T$ is carried out according to $$c_{n+1} = c_n + \mu \cdot e(n) \cdot \frac{x}{\|x\|}$$

With $x = [x(n), x(n-1), \ldots, x(n-L)]^T$. Here, the coefficient update unit 52 requires the estimation of the input signal power level which is implemented through an asymmetric smoothing process where the recursive smoothing is performed with different factors $\beta_{up}$ and $\beta_{down}$, respectively, for an increasing and a decreasing input power level according to the recursive equation for the; time domain explained above.

Therefore, the time domain implementation of the adaptive digital filter allows for a convergence of the adaptive filter which is independent of the power level of the input signal in accordance with the normalized least mean square algorithm. Further, the step size p is the degree of freedom to determine the convergence behaviour of the time domain digital adaptive filter.

According to the present invention, different β-factors avoid a step size too large in case of a rapid input power increase which would eventually cause instability. Therefore, overall a faster convergence is achieved when compared with the solution using only a single factor. This leads to a better performance of the time domain adaptive filter and therefore to a better quality of devices using this time domain adaptive filter.

Figure 6:
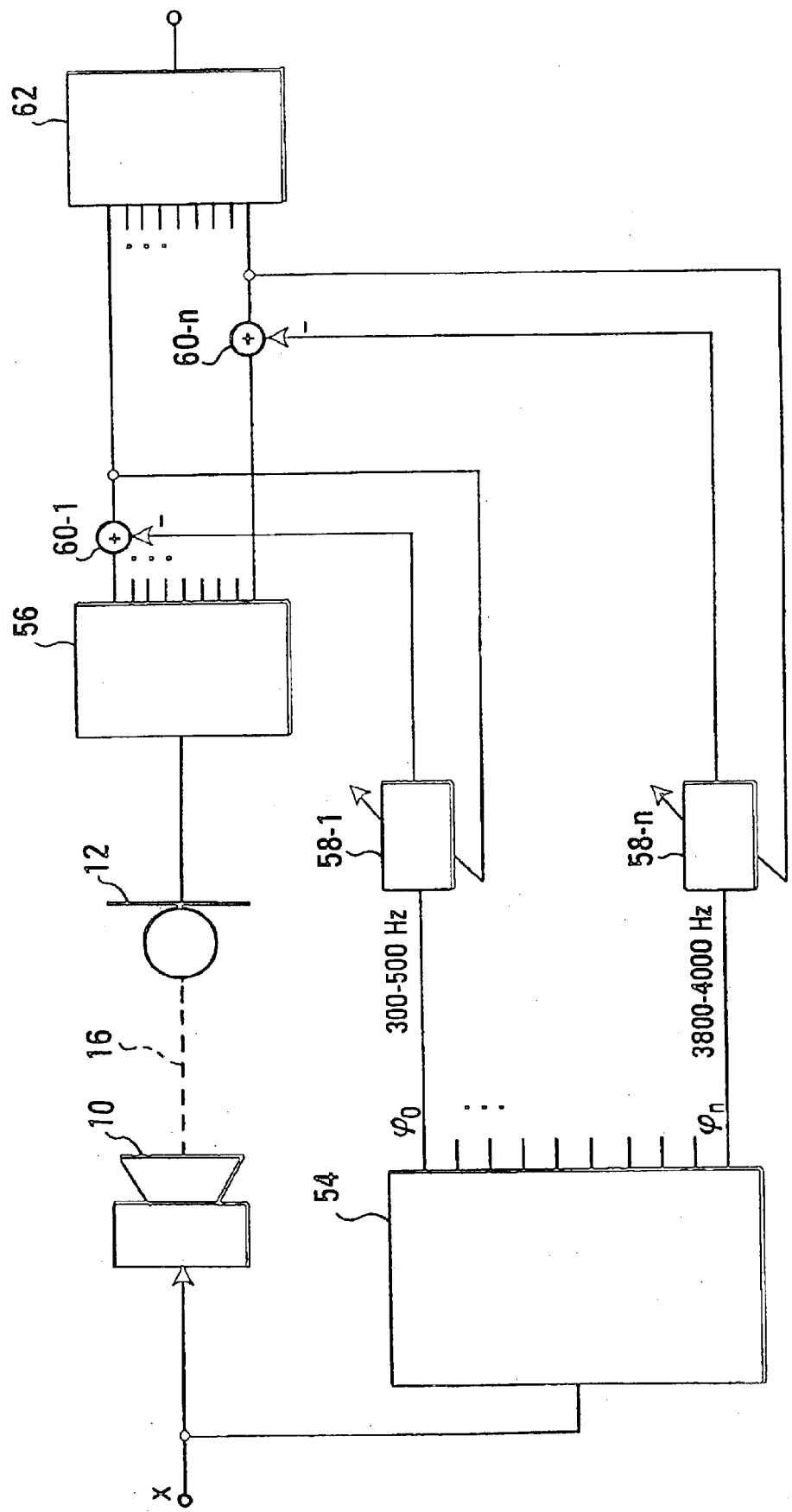
FIG. 6 shows an exemplary subband type adaptive filter implementation using the asymmetric power level estimation according to the present invention.

A further embodiment of the present invention is related to a subband adaptive digital filter as shown in FIG. 6. Here, there is provided an analysis filter bank 54 to filter an input signal x to the loudspeaker 10 into at least two frequency bands. In addition, a second analysis filter bank 56 filters the output of the microphone 12 again into at least two frequency bands corresponding to the frequency bands provided through the first analysis filter bank 54.

As shown in FIG. 6, for each frequency band provided through the first and second analysis filter bank 54 and 56, respectively, there is provided a subband filter 58-1, . . . , 58-n to model the transmission behaviour along the echo propagation path 16 in this frequency band. The output signal of each subband filter 58-1, . . . , 58-n may then be combined with the related output signal of the second analysis filter bank 56 to derive an error signal for each frequency band which may then be used to tune the related subband filter 58-1, . . . , 58-n. To derive the error signals there are provided related adders 60-1, . . . , 60-n the outputs of which feed a synthesis filter bank 62 that generates a time domain output signal for the subband output signals.

The advantage of this embodiment of the present invention is that it allows scalability for the filtering in different frequency bands. Also, the subband adaptive filter is well suited to filter frequency selective disturbance signals on the echo propagation path as these disturbance signals may be specifically compensated for through the single subband filters. Still further, for each subband there may be chosen a respective step size for the update for filter coefficients.

A further embodiment of the present invention relies on a frequency domain approach that requires a transformation to the frequency domain and adds therefore an additional effort which pays off in case the filter length exceeds a certain threshold length. For very long filter lengths the frequency domain approach is superior over the time domain approach in terms of processing complexity.

Further, in case the frequency domain filtering technique is running on a block basis a series of input samples must be collected until the block processing can be performed. This produces an inherent delay which is dependent on the transformation length and be considered in the embodiment to be described in the following.

Figure 7:
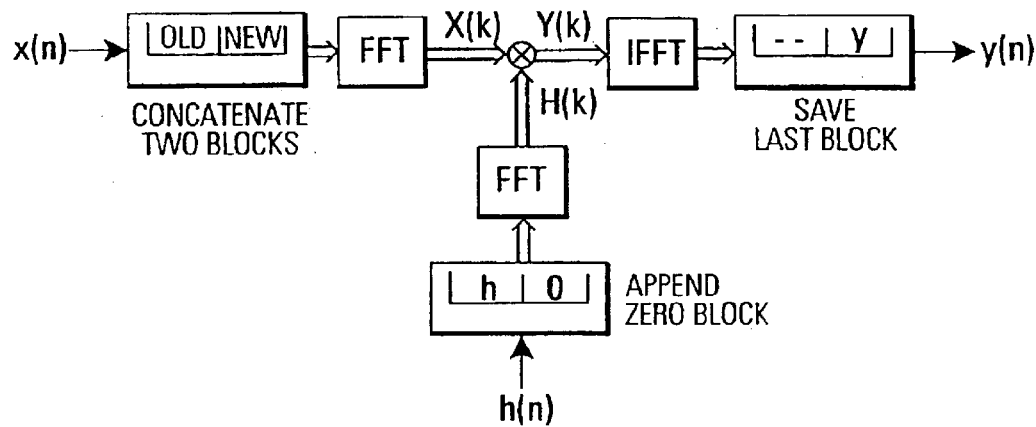
FIG. 7 shows one basic approach underlying adaptive frequency domain filtering.

As shown in FIG. 7, the input signal is divided into segments of, e.g., equal length which are successively convolved with the impulse response, or equivalently the Fast Fourier Transform X(k) of the input signal x(n) is multiplied with the transfer function H(k) of the impulse response h(n). Then, after the inverse Fast Fourier Transform a last block of the result is saved as output: signal.

Figure 8:
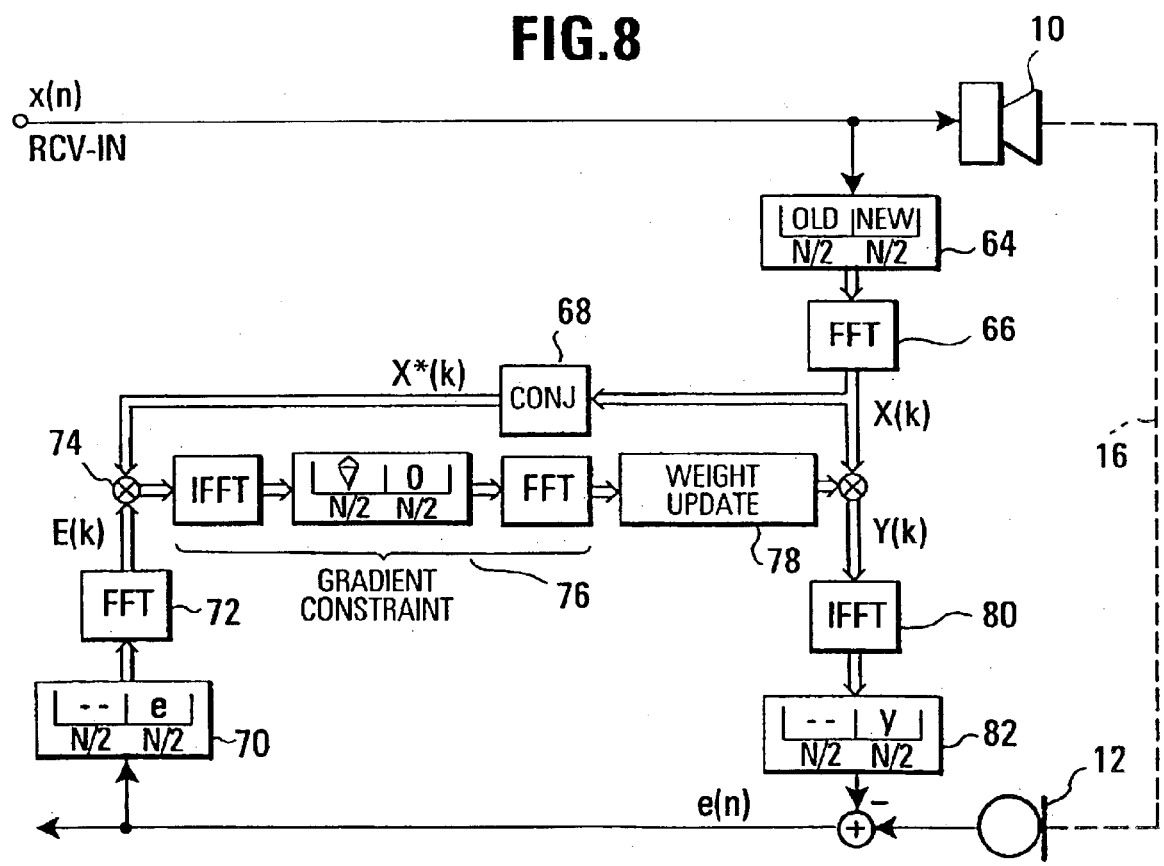
FIG. 8 shows an exemplary schematic diagram for a frequency domain implementation of the digital adaptive filter using a asymmetric power level estimation according to the present invention.

FIG. 8 shows how the frequency domain adaptive filter shown in FIG. 7 may be used for echo cancellation.

Here, the input signal x(n) is the signal on the line RCV-IN being provided to the loudspeaker 10. Within the adaptive filter this signal is sub-divided by an input signal segmentation unit 64. This input signal segmentation unit 64 is connected to a FFT transformation unit 66. To the output of this FFT transformation unit 66 there is connected a complex conjugate unit 68 deriving the complex conjugate X*(k) of the frequency domain representation X(k) of the input signal x(n).

As also shown in FIG. 8, an error signal e(n) is provided as second input signal to the adaptive filter via a second input signal segmentation unit 70. The output of this second input signal segmentation unit 70 is connected to a second FFT transformation unit 72. The frequency domain representation E(n) of the error signal e(n) and the complex conjugate X*(k) of the frequency domain representation of the input signal is then multiplied in a first multiplication unit 74.

As also shown in FIG. 8, the output of this first multiplication unit 74 is connected to the input of a gradient constraint unit 76 which itself is connected to the filter coefficient update unit 78. At the output of the filter coefficient update unit 78 the corresponding filter coefficients are multiplied with the frequency domain representation of the input signal X(k) to determine the frequency domain representation of the filter output signal Y(k) which is submitted to an inverse FFT transformation in a first retransformation unit 80. Finally, the last block of the time domain representation of the output signal of the adaptive filter is saved in a storage unit 82 providing the output signal.

According to the invention the filter coefficient update unit 78 is of particular importance as it completes the frequency domain adaptive filter. In particular, the structure shown in FIG. 8 is of the constraint type, as the gradient of change during the adjustment of frequency domain filter coefficient is restricted by the gradient constraint unit 76. While an unconstrained structure would result in a saving of two FFT transformations the convergence of the inventive frequency domain adaptive filter is larger due to an improved adjustment.

Figure 9:
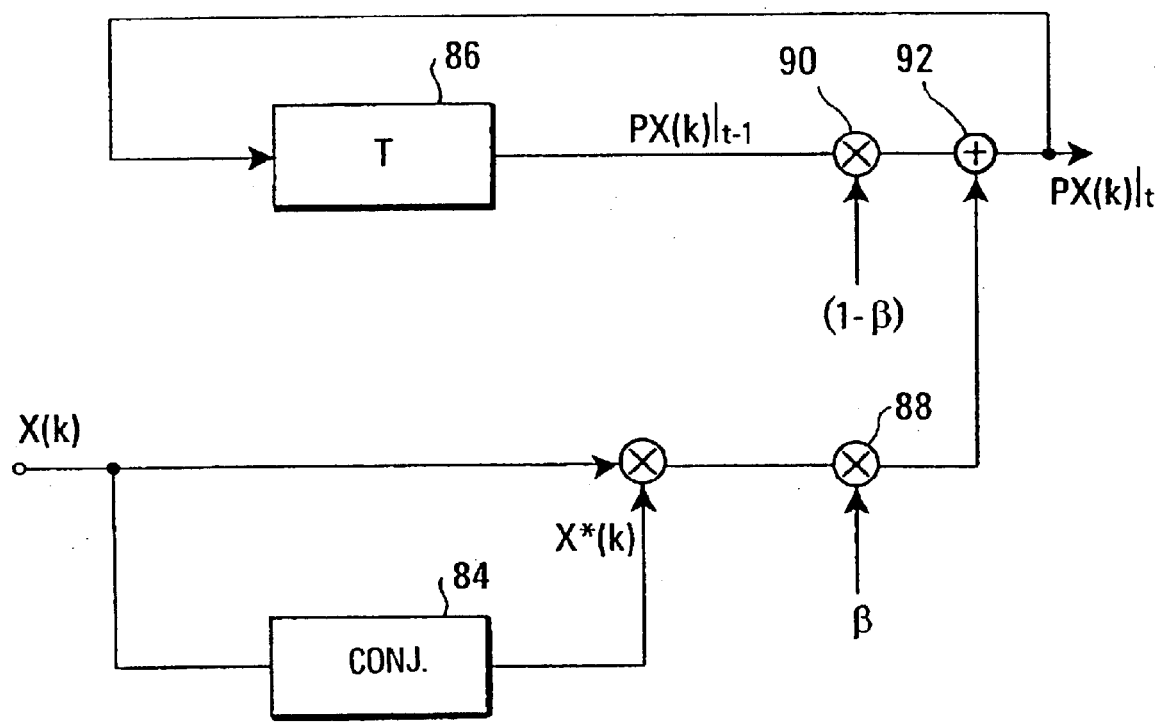
FIG. 9 shows an exemplary signal flow diagram for the asymmetric power level estimation in the frequency domain according to the present invention.

FIG. 9 shows a more detailed exemplary block diagram for the power estimation in the frequency domain according to the present invention. The structure shown in FIG. 9 implements the equation $$PX(k)|_t = \beta \cdot X(k) \cdot X*(k) + (1-\beta) \cdot PX(k)|_{t-1} k = 0, \ldots, \frac{N}{2}+1$$

$$\beta = \begin{cases} \beta_{up} & PX \text{ increasing} \\ \beta_{down} & PX \text{ decreasing} \end{cases}$$

and comprises a second complex conjugate unit 84 and a delay unit 86 to achieve the recursive estimation of the power level. As outlined above, two asymmetric smoothing factors β and 1-β, respectively, are supplied to multiplication units 88 and 90, respectively. Then both multiplication results are added in an adder 92 to calculate the estimated power of the input signal.

The filter coefficient update process for the frequency domain adaptive filter using this estimated input signal power level is carried out in the filter coefficient update unit 78 according to $$H(k)|_{t+1} = H(k)|_t + \mu(k) \cdot \frac{E(k)}{PX(k)|_t} \cdot X*(k) \cdot G(k)$$

$$k = 0, \ldots, \frac{N}{2}+1$$

Here, the new coefficients $H(k)|_{t+1}$ are derived from the old coefficients $H(k)|_t$ by adding a certain increment that according to the invention is defined by:

μ(k) individual step size for each frequency bin

E(k) error signal (residual signal after summation point)

X*(k) complex conjugate of the transformed loudspeaker signal

PX(k) estimated power of the transformed loudspeaker signal

G(k) gradient constraint operation due to cyclic FFT characteristics

Therefore, according to the present invention the step size μ(k) is calculated individually for each frequency band and depends on the background noise level in that specific frequency band. Usually, the lower the background noise, the larger the step size will be. Thus, as the background noise inside, e.g., a vehicle does not have a flat spectrum, the present invention allows for an optimum convergence adapted to the prevailing situation. In conclusion, the convergence speed may be adapted individually to the frequency characteristics of the background noise resulting in a better performance of the adaptive filter and thus in a better performance quality of the device using the frequency domain adaptive filter according to the present invention, e.g., an acoustic echo canceller or a teleconference communication device.

Another impact of the band-specific normalization is the equivalent effect of a decorrelation of the input signal. Therefore, the convergence for, colored signals like speech may be improved, "A Globally Optimised Frequency Domain Acoustic Echo Canceller for Adverse Environment Applications", J. Boudy, F. Chapman, P. Lockwood, 4th International Workshop on Acoustic Echo and Noise Control, 21–23 June 1995, Roros, Norway, pp. 95–98.

Further, for the structure shown in FIG. 8 the block length is not restricted to a power of 2. To the contrary, in the structure shown in FIG. 8 also a input length K and a FFT length N may be chosen to satisfy

N≥2K

Thus, this embodiment of the present invention allows for an increased range of possible applications. One example is GSM where the speech coder is running on a 20 milliseconds basis or equivalently 160 samples. This value is not a power of 2.

Further, with the adaptive frequency domain filter shown in FIG. 8, the filtering technique is running on a block basis and a series of input samples must be collected until the block processing can be performed. This produces an inherent delay which is dependent on the FFT length and should be considered in a real time application. To overcome this drawback, a large FFT transformation may be split into smaller portions, i.e. it may be partitioned. According to the present invention, this leads to a partitioned block frequency domain adaptive filter to be explained in the following.

Figure 10:
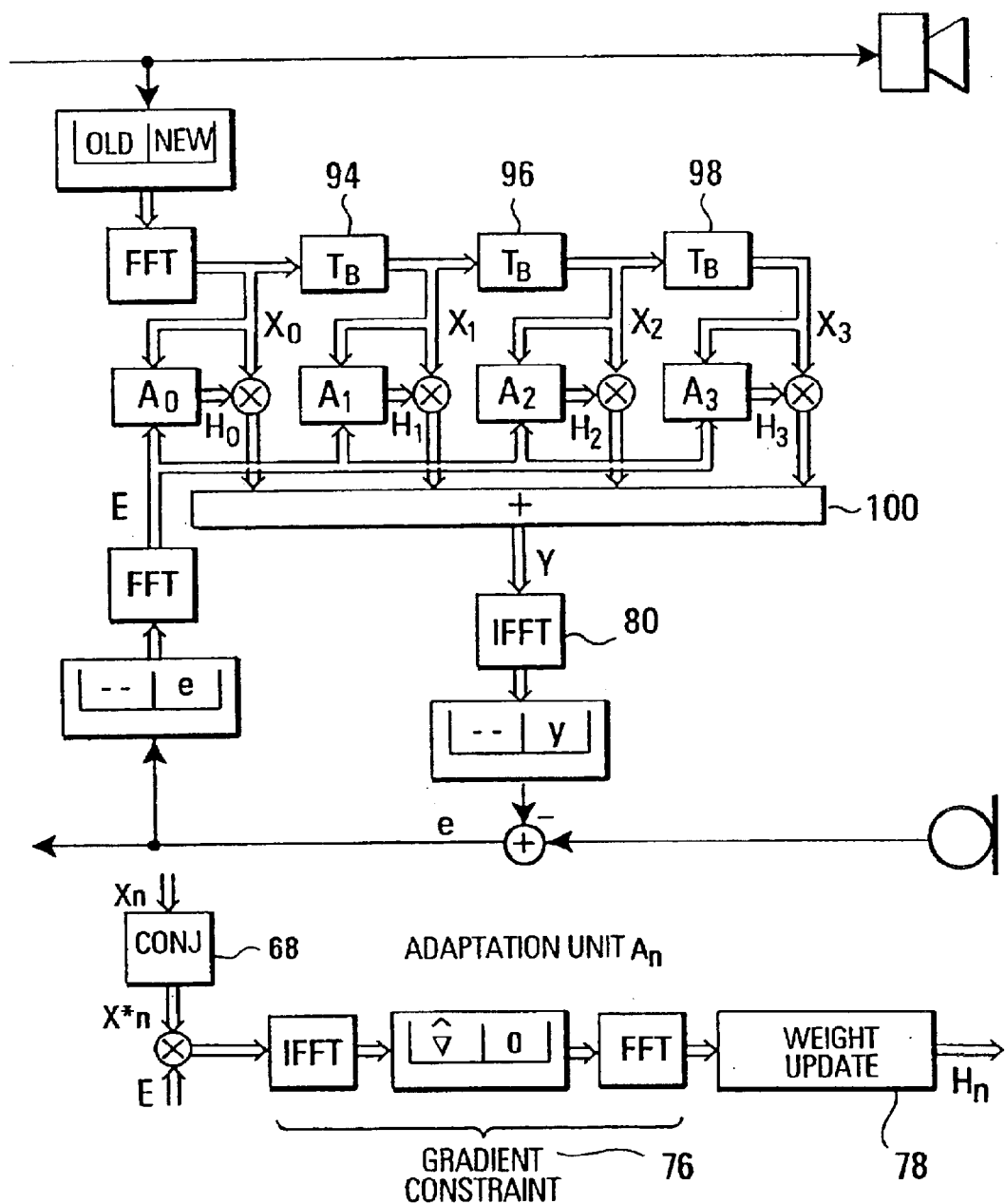
FIG. 10 shows an exemplary block partitioned frequency domain realization of the digital adaptive filter using the asymmetric power level estimation according to the present invention.

FIG. 10 shows such an exemplary partitioned block frequency domain adaptive filter according to the present invention. As shown in FIG. 10, this embodiment of the frequency domain adaptive filter uses four partitions n=0, . . . , 3. Using four partitions results in a FFT length which is ¼ of the original length. Thus, also the delay is reduced to b ¼. However, according to this embodiment the computational effort is slightly increased and the decorrelation effect for the input signal x(n) is reduced due to the shorter FFT length.

As shown in FIG. 10, the partitioned block frequency domain adaptive filter has the complex conjugate unit 68, the gradient constraint unit 76, and the filter coefficient update unit 78 duplicated into each singular block of the frequency domain adaptive filter. In particular, the different filter coefficient update units of the partitioned block frequency domain adaptive filter are denoted through the reference numerals $A_0$, $A_1$, $A_2$, and $A_3$, respectively. Also, to achieve the block partition it is necessary to provide additional delay units 94, 96, 98, respectively. Finally, the output according to each of the partition blocks in the frequency domain adaptive filter are added in a vector adding unit 100, the output of which is supplied to the first inverse FFT unit 80 already shown in FIG. 8.

In considering the function of the structure shown in FIG. 10 it should be noted that the FFT length is chosen to, e.g., 128, resulting in an echo path length of 32 milliseconds, i.e. 256 taps at 8 kHz sampling frequency. The first block $H_0$ contains the first 64 taps, the second block $H_1$ contains the next 64 taps and so on. The same holds for the input vector blocks $X_0$–$X_3$. The delay units 94–98 symbolize a delay by one block. A partition factor of 4 has an inherent delay of 8 msec plus some processing delay.

The filter coefficient update is similar to the update performed in the time domain NLMS algorithm, i.e. the error signal is normalized by the input power and the new coefficients are derived from the old ones by adding a certain step depending on the input vector. The difference to the time domain NLMS is that the normalization is performed individually for each frequency bin and that the step size μ is controlled individually for each frequency bin to optimize convergence properties as outlined above.

The estimation of the input power is based on the power of the block input signals $X_0$–$X_3$ and on the old estimated input power. According to the invention a recursive smoothing is performed with different, asymmetric smoothing factors for increasing and decreasing power. Two different smoothing factors are used to avoid a too large step size in case of rapid input power increase which would cause instability. The input power is estimated for each frequency bin. The input power is denoted by PX.

$$PX(k)\big|_t = \beta \cdot \sum_{n=0}^{3}(X_n(k) \cdot X_n^*(k)) + (1-\beta) \cdot PX(k)\big|_{t-1}$$

$$k = 0, \ldots, \frac{N}{2} + 1$$

$$\beta = \begin{cases} \beta_{up} & PX \text{ increasing} \\ \beta_{down} & PX \text{ decreasing} \end{cases}$$

As with the embodiments according to FIG. 8 also for the partitioned block frequency domain adaptive filter according to the present invention the step size μ determines the stability, the speed of convergence and the final misadjustment error. A large step size will result in a fast convergence, but also in a high gradient noise and vice versa. In the presence of additional noise, e.g., car background noise, the step size has to be reduced to avoid instability.

While in the above different embodiments of a frequency domain adaptive filter according to the invention have been explained, in the following reference will be made to an acoustic echo canceller using such a frequency domain adaptive filter. One typical application of such an acoustic echo canceller would be a hands-free communication device, a teleconference communication device or a multimedia terminal.

Figure 11:
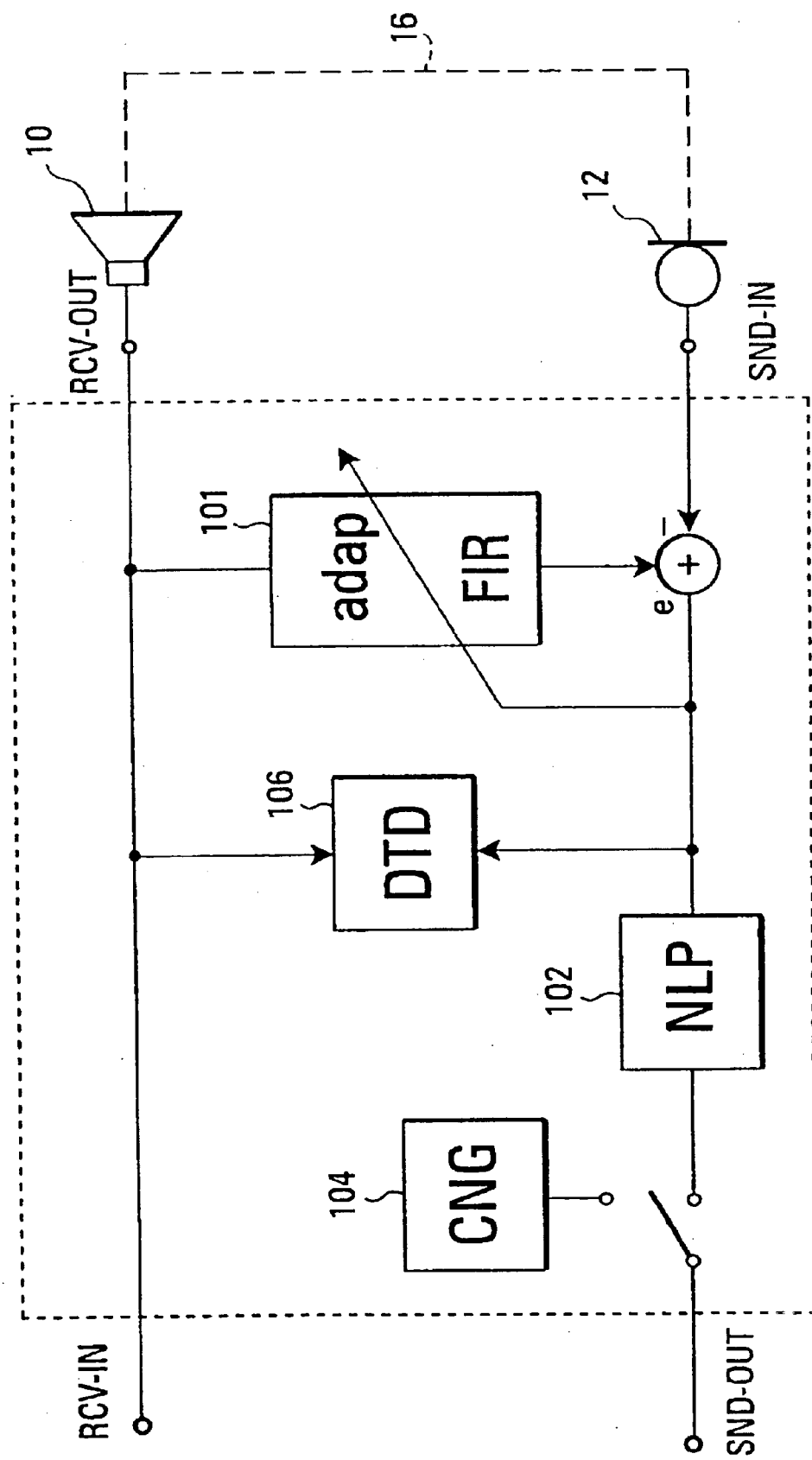
FIG. 11 shows an exemplary block diagram of the acoustic echo canceller according to the present invention.

FIG. 11 shows an exemplary block diagram of an acoustic echo canceller according to the present invention. Here, the adaptive filter generates a synthetic echo which should be identical to the real echo for antiphase compensation. Due to the limited performance of the adaptive filter, the residual echo e after the summation point is still perceivable and it is removed by a non-linear processor 102, e.g., a center clipper. However, the non-linear processor 102 eliminates not only the residual echo but also the background noise of the near end talker in front of the microphone 12. This generates a feeling of a broken line for the far end speaker. An approach to overcome this problem is to provide a comfort noise generator 104.

As shown in FIG. 11, the acoustic echo canceller is controlled by a communication monitoring unit 106 also referred to as double talk detector in the following. This double talk detector 106 distinguishes between the different states of the acoustic echo canceller and controls the adaptation process for the adaptive filter.

With respect to stability it should be noted that usually a rather high volume of the loudspeaker signal must be provided, e.g., in a car to guarantee optimum communication. This implies a system working above the stability margin which can lead to howling effect if the adaptive filter cannot yield sufficient attenuation. For high loudspeaker volumes the combination of voice switching and an acoustic echo canceller is successful in the practical implementation of the invention.

As already mentioned above, the non-linear processor 102 may be implemented as a center clipper with an adaptive threshold. The threshold is chosen higher than the expected echo level after linear compensation to suppress all the residual echoes. This expected echo level is the RCV-OUT level reduced by the echo return loss and echo return loss enhancement value, respectively. The non-linear processor 102 is active only in case of a single activity of the far end speaker. It is not active if the near end speaker is active to avoid any clipping and when nobody is talking to transmit the background noise.

Still further, the double talk detector 106 shown in FIG. 11 performs the control of the complete acoustic echo canceller. Thus, it controls the adaptive filter, the non-linear processor 102, and the comfort noise generator 104, respectively, as shown in FIG. 11.

Figure 12:
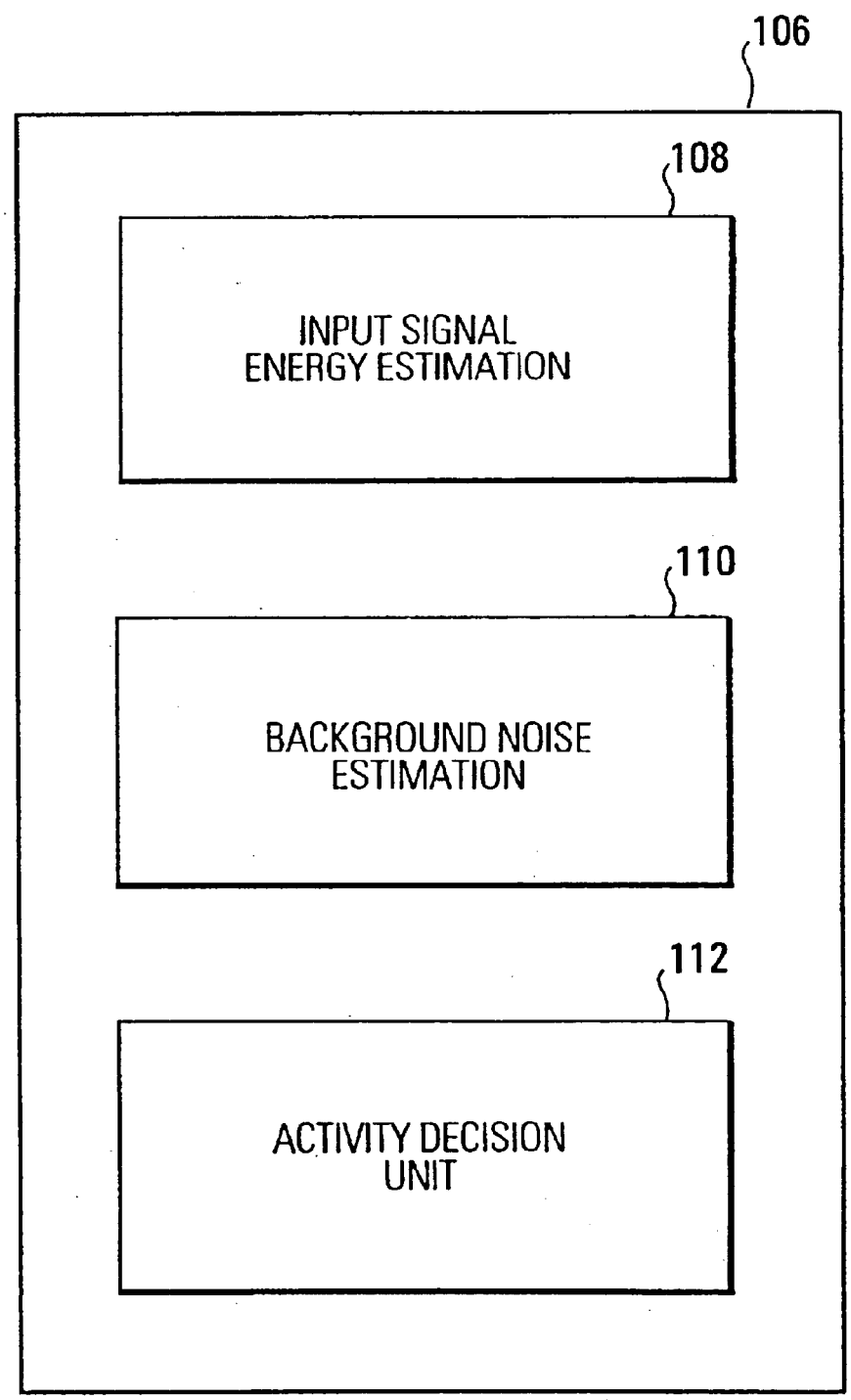
FIG. 12 shows an exemplary block diagram of the communication monitoring unit shown in FIG. 11.

As shown in FIG. 12, the double talk detector 106 comprises a unit 108 to estimate the energy of the input signal, a unit 110 to estimate the background noise, and a unit 112 to decide on the activity of the near end speaker and far end speaker, respectively. In particular, the double talk detector 106 distinguishes between four states and performs different tasks depending on the state:

Idle: nobody is talking

Near End Active: the person in front of the microphone is talking

Far End Active: a signal is coming from the far end side

Double Talk: a signal is coming from the far end and the near end speaker is active As shown in FIG. 12, the double talk detector 106 must estimate the input signal energy and the background noise so as to draw a secure state decision. According to Parseval's theorem the energy can be calculated in time domain as well as in the frequency domain:

$$\sum_{n=0}^{N-1} |x(n)|^2 = \frac{1}{N} \sum_{k=0}^{N-1} |X(k)|^2$$

In the frequency domain a linear envelope "$Env_{lin}$" can be calculated and recursively smoothed according to:

$$P_{lin} = \frac{1}{\frac{N}{2}+1} \cdot \frac{1}{\frac{N}{2}+1} \cdot \sum_{k=0}^{\frac{N}{2}} X(k)X*(k)$$

$$Env_{lin}|_t = \beta \cdot P_{lin} + (1-\beta) \cdot Env_{lin}|_{t-1}$$

$$\beta = \begin{cases} \beta_{up} & P_{lin} \text{ increasing} \\ \beta_{down} & P_{lin} \text{ decreasing} \end{cases}$$

As also shown in FIG. 12, the double talk detector 106 comprises a background noise estimation unit 110. This is to take into consideration that, e.g., a mobile application implies a high background noise level. This noise is coming mainly from the tires and the wind and is short term stationary. It is essential to distinguish between background noise and near end talker to achieve a secure state decision.

The background noise estimation unit 110 is active for the near end signal and for the far end signal. At the far end side switching devices may be connected producing fast changing background noise levels. Also, the background noise estimation unit 110 is based on following assumptions:

the background noise is long term stationary;

the speech signal is instationary; and the background noise level may change rapidly.

Based on the input energy level and the estimated background noise level of the SND-IN and RCV-IN signals first activity decisions for SND-IN and RCV-IN inputs are performed by the activity decision unit 112 of the double talk detector 106. Here, if the input level exceeds the estimated background noise level by a certain threshold, the input is marked as active, inactive. Thus, the activity decision unit 112 distinguishes between four different states:

Idle

Near End Active

Far End Active

Double Talk.

Although preferred embodiments of the method and apparatus of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

| List of Abbreviations | |
| --- | --- |
| AEC | Acoustic Echo Canceller |
| BGN | Background Noise |
| CNG | Comfort Noise Generator |
| DTD | Double Talk Detector |
| Far end signal | Signal coming from the line and going to the loudspeaker |
| FDAEC | Frequency Domain Acoustic Echo Canceller |
| FDAF | Frequency Domain Adaptive Filter |
| FFT | Fast Fourier Transform |
| FIR | Finite Impulse Response |
| G | Gradient Constraint |
| IFFT | Inverse Fast Fourier Transform |
| k | Index for Frequency Band |
| L | Filter length |
| N | Length of FFT |
| near end signal | Signal picked up by the microphone and going to the line |
| NLMS | Normalized Least Mean Square |
| NLP | Non Linear Processor |
| PBFDAF | Partitioned Block Frequency Domain Adaptive Filter |
| PX | Estimated input power of loudspeaker signal |
| RCV | Receive |
| RCV—IN | Receive Input (Input from far end) |

-continued

List of Abbreviations

| | |
|---|---|
| RCV—OUT | Receive Output (Output to loudspeaker) |
| SND | Send |
| SND—IN | Send Input (Input from Microphone) |
| SND—OUT | Send Output (Output to far end) |
| TDAEC | Time Domain Acoustic Echo Canceller |
| $T_B$ | Signal delay by one block |
| X(k) | Frequency domain representation of input signal x (n) |
| X*(k) | Conjugate Complex Vector of X |
| β | Smoothing Factor |
| μ | Step Size |
| y(n) | Time Domain Output Signal of Frequency Domain Adaptive Filter |

What is claimed is:

1. A digital adaptive filter for modeling a signal path between a loudspeaker and a microphone of a hands-free communication device, comprising:

filter coefficient update means to successively update filter coefficients in accordance with an input signal, an estimated power of the input signal, and an error signal between the input signal filtered in the digital adaptive filter and an input signal propagated along an external path being modeled by the digital adaptive filter; and input signal power estimation means adapted to perform recursive smoothing for an increasing input power and a decreasing input power asymmetrically with a different weighting factor for an increasing input signal power level and a decreasing input signal power level, wherein the input signal power estimation means performs the recursive smoothing of the input power according to:

$$PI = \beta \circ Pin|_r + (1-\beta) \circ PI|_{i \cdot j}$$

$$\beta = \begin{cases} \beta_{up} & PI \text{ increasing} \\ \beta_{down} & PI \text{ decreasing.} \end{cases}$$

2. The digital adaptive filter according to claim 1, wherein the input signal power estimation means performs the recursive smoothing of the input power in a time domain according to $$PX|_n = \beta \circ x(n) \circ x(n) + (1-\beta) \circ PX|_{n-t}$$

$$\beta = \begin{cases} \beta_{up} & PX \text{ increasing} \\ \beta_{down} & PX \text{ decreasing.} \end{cases}$$

3. The digital adaptive filter according to claim 1, wherein the input signal power estimation means performs the recursive smoothing of the input power in a frequency domain according to $$PX(k)|_t = \beta \circ X(k) \circ X^n(k) + (1-\beta) \circ PX(k)|_{t-1}$$

$$k = 0, \ldots, \frac{N}{2}+1$$

$$\beta = \begin{cases} \beta_{up} & PX \text{ increasing} \\ \beta_{down} & PX \text{ decreasing.} \end{cases}$$

4. The digital adaptive filter according to claim 1, wherein the filter coefficient update means is adapted to calculate a step size for at least one frequency band individually in dependence on a background noise level of the at least one frequency band.

5. A frequency domain adaptive filter for modeling a signal path between a loudspeaker and a microphone of a hands-free communication device, comprising:

an input terminal adapted to receive an input signal; and filter coefficient update means to successively update filter coefficients in accordance with the input signal, an estimated power of the input signal, and an error signal between the input signal filtered in the frequency domain adaptive filter and an input signal propagated along an external path being modeled by the frequency domain adaptive filter, the filter coefficient update means adapted to calculate a step size for at least each frequency band individually in dependence on a background noise level of each frequency band, wherein the filter coefficient update means updates the filter coefficients according to $$H(k)|_{s,t} = H(k)|_s + \mu(k) \circ \frac{E(k)}{PX(k)|_s} \circ X \ast (k) \circ G(k)$$

$$k = 0, \ldots, \frac{N}{2}+1,$$

where

μ(k) is the individual step size for each frequency band,

E(k) is a transformed error signal,

X*(k) is a complex conjugate of a transformed loudspeaker signal,

PX(k) is an estimated power of the transformed loudspeaker signal, and

G(k) is a gradient constraint operation.

6. The frequency domain adaptive filter according to claim 5, further comprising an input signal power estimation means adapted to perform recursive smoothing for an increasing input power and a decreasing input power asymmetrically.

7. The frequency domain adaptive filter according to claim 5, further comprising a gradient constraint means to achieve optimal convergence of the filter coefficients.

8. The frequency domain adaptive filter according to claim 5, wherein the frequency domain adaptive filter is of a block partitioned type.

9. The frequency domain adaptive filter according to claim 5, wherein the frequency domain adaptive filter is of a type with variable input length K chosen to satisfy

N≧2K, where N is a Fast Fourier Transform (FFT) length and K is not restricted to a power of 2.

10. A subband adaptive filter for modeling a signal path between a loudspeaker and a microphone of a hands-free communication device, comprising:

an analysis filter bank adapted to filter an input signal into at least two frequency bands;

a corresponding subband filter for each of the at least two frequency bands to filter the corresponding frequency band supplied thereto; and a synthesis filter bank adapted to generate a time domain output signal from the output of the subband filters, wherein each subband filter comprises filter coefficient update means to successively update filter coefficients in accordance with the corresponding frequency band supplied thereto, an estimated power thereof, and a subband error signal between the corresponding frequency band and a corresponding frequency band input signal propagated along an external path being modeled through the subband adaptive filter, and wherein the filter coefficient update means is adapted to calculate a step size for each corresponding frequency band individually in dependence on a background noise level for each corresponding frequency band, and wherein the filter coefficient update means of each subband filter is adapted to perform recursive smoothing for an increasing input power and a decreasing input power asymmetrically, wherein an input signal power estimation means performs the recursive smoothing of the input power according to:

$$PI| = \beta \circ Pin|_r + (J - \beta) \circ PJ|_{i \cdot j}$$

$$\beta = \begin{cases} \beta_{up} & PI \text{ increasing} \\ \beta_{down} & PI \text{ decreasing.} \end{cases}$$

11. A digital adaptive filtering method for modeling a signal path between a loudspeaker and a microphone of a hands-free communication device, comprising the steps of:
successively updating filter coefficients in accordance with an input signal, an estimated power of the input signal, and an error signal between the input signal for the digital adaptive filtering method and die input signal propagated along an external path being modeled through the digital adaptive filtering method; and
performing recursive smoothing for an increasing input power and a decreasing input power asymmetrically with a different weighting factor for en increasing input signal power level and a decreasing input signal power level, wherein the input power is smoothed recursively according to:

$$PI| = \beta \circ Pin|_r + (I - \beta) \circ PI|_{i \cdot j}$$

$$\beta = \begin{cases} \beta_{up} & PI \text{ increasing} \\ \beta_{down} & PI \text{ decreasing.} \end{cases}$$

12. The digital adaptive filtering method according to claim 11, wherein the input power is smoothed recursively in a time domain according to $$PX|_n = \beta \cdot x(n) \cdot x(n) + (1 - \beta) \cdot PX|_{n+1}$$

$$\beta = \begin{cases} \beta_{up} & PX \text{ increasing} \\ \beta_{down} & PX \text{ decreasing.} \end{cases}$$

13. The digital adaptive filtering method according to claim 11, wherein the input power is smoothed recursively in a frequency domain according to $$PX(k)|_s = \beta \cdot X9k) \cdot X^n(k) + (1 - \beta) \cdot PX(k)|_{s-1}$$

$$k = 0, \ldots, \frac{N}{2} + 1$$

$$\beta = \begin{cases} \beta_{up} & PX \text{ increasing} \\ \beta_{down} & PX \text{ decreasing.} \end{cases}$$

14. The digital adaptive filtering method according to claim 13, wherein a step size for at least one frequency band is calculated individually in dependence on a background noise level of the frequency band.

15. A frequency domain adaptive filtering method for modeling a signal path between a loudspeaker and a microphone of a hands-free communication device, comprising the steps of:
successively updating filter coefficients in accordance with an input signal, an estimated power of the input signal, and an error signal between the input signal filtered according to the frequency domain adaptive filtering method and an input signal propagated along an external path being modeled through the frequency domain adaptive filtering method; and
calculating a step size for at least two frequency bands individually in dependence on a background noise level of each frequency band, wherein filter coefficients are updated according to $$H(k)|_{r,s} = H(k)|_t + \mu(k) \circ \frac{E(k)}{PX(k)|_t} \circ X^*(k) \circ G(k)$$

$$k = 0, \ldots, \frac{N}{2} + 1.$$

where
$\mu(k)$ is the individual step size for each frequency band,
$E(k)$ is a transformed error signal,
$X^*(k)$ is a complex conjugate of a transformed loudspeaker signal,
$PX(k)$ is an estimated power of the transformed loudspeaker signal, and
$G(k)$ is a gradient constraint operation.

16. The frequency domain adaptive filtering method according to claim 15, further comprising the step of performing a recursive smoothing for an increasing input power and a decreasing input power asymmetrically.

17. A digital adaptive filtering method of the subband type for modeling a signal path between a loudspeaker and a microphone for a hands-free communication device, comprising the steps of:
filtering an input signal into at least two frequency bands in an analysis filter bank;
filtering each of the at least two frequency bands in a corresponding subband filter;
generating a time domain output signal from the output of the subband filters in a synthesis filter bank, wherein in each subband filter coefficients are successively updated in accordance with the frequency band supplied thereto, an estimated power thereof, and a subband error signal between the frequency band and a corresponding frequency band input signal propagated along an external path being modeled through the digital adaptive filtering method of the subband type, and wherein a step size for each frequency band is calculated individually in dependence on a background noise level for each frequency band; and
performing recursive smoothing for an increasing input pouter and a decreasing input power asymmetrically, wherein the recursive smoothing of the input power is performed according to:

$$PI| = \beta \circ Pin|_r + (I - \beta) \circ PI|_{i \cdot j}$$

$$\beta = \begin{cases} \beta_{up} & PI \text{ increasing} \\ \beta_{down} & PI \text{ decreasing.} \end{cases}$$

* * * * *

UNITED STATES PATENT AND TRADEMARK OFFICE
CERTIFICATE OF CORRECTION

PATENT NO. : 6,842,516 B1
APPLICATION NO. : 09/353484
DATED : January 11, 2005
INVENTOR(S) : Armbruster It is certified that error appears in the above-identified patent and that said Letters Patent is hereby corrected as shown below:

In Column 1, Line 59, after "antiphase" delete "w".

In Column 2, Line 10, delete "pathy" and insert -- path --, therefor.

In Column 3, Line 43, after "bands that" insert -- are --.

In Column 5, Line 26, delete " $PI|_t = \beta \bullet Pin|_t + (1-\beta) \bullet PI_t-_j$ " and insert -- $PI|_t = \beta \bullet Pin|_t + (1-\beta) \bullet PI_t-_j$ --.

In Column 5, Line 35, delete "$PI|_{1-1}$" and insert -- $Pin|_t$ --, therefor.

In Column 5, Line 55, delete " $PX|_n = \beta \bullet x(n) \bullet x(n) + (1-\beta) \bullet PX|_{r-1}$ " and insert -- $PX|_n = \beta \bullet x(n) \bullet x(n) + (1-\beta) \bullet PX|_{n-1}$ --, therefor.

In Column 5, Line 62, delete "x(n)~x(n)" and insert -- x(n).x(n) --, therefor.

In Column 5, Line 63, delete "+previous" and insert -- previous --, therefor.

In Column 6, Line 7, delete "derivatives" and insert -- derivation --, therefor.

In Column 6, Line 64, delete "the;" and insert -- the --, therefor.

In Column 7, Line 3, delete "p" and insert -- μ --, therefor.

In Column 7, Line 54, after "length and" insert -- should --.

In Column 9, Line 27, delete "for," and insert -- for --, therefor.

In Column 9, Line 60, after "reduced to" delete "b".

In Column 12, Line 28, after "active," insert -- otherwise --.

In Column 13, Line 36, in Claim 1, delete " $PI|_t = \beta \bullet Pin|_t + (1-\beta) \bullet PI_t-_j$ " and insert -- $PI|_t = \beta \bullet Pin|_t + (1-\beta) \bullet PI|_{t-1}$ --.

UNITED STATES PATENT AND TRADEMARK OFFICE
CERTIFICATE OF CORRECTION

PATENT NO. : 6,842,516 B1
APPLICATION NO. : 09/353484
DATED : January 11, 2005
INVENTOR(S) : Armbruster It is certified that error appears in the above-identified patent and that said Letters Patent is hereby corrected as shown below:

In Column 14, Line 20, in Claim 5, delete " $H(k)|_{t+1} = H(k)_s + \mu(k) \cdot \frac{E(k)}{PX(k)|_t} \cdot X^*(k) \cdot G(k)$ "

and insert -- $H(k)|_{t+1} = H(k)|_t + \mu(k) \cdot \frac{E(k)}{PX(k)|_t} \cdot X^*(k) \cdot G(k)$ --, therefor.

In Column 15, Line 15, in Claim 10, delete " $PI|_1 = \beta \cdot Pin|_t + (1-\beta) \cdot PI|_{t-1}$ "

and insert -- $PI|_t = \beta \cdot Pin|_t + (1-\beta) \cdot PI|_{t-1}$ --, therefor.

In Column 15, Line 32, in Claim 11, delete "en" and insert -- an --, therefor.

In Column 15, Line 36, in Claim 11, delete " $PI|_t = \beta \cdot Pin|_t + (1-\beta) \cdot PI_t -_1$ " and insert -- $PI|_t = \beta \cdot Pin|_t + (1-\beta) \cdot PI|_{t-1}$ --, therefor.

In Column 15, Line 56, in Claim 13, delete

" $PX(k)|_t = \beta \cdot X(k) \cdot X^*(k) + (1-\beta) \cdot PX(k)|_{t-1}$ " and insert -- $PX(k)|_t = \beta \cdot X(k) \cdot X^*(k) + (1-\beta) \cdot PX(k)|_{t-1}, k = 0,\ldots,\frac{N}{2}+1$ --, therefor.

In Column 16, Line 16, in Claim 15, delete " $H(k)|_{t+1} = H(k)_s + \mu(k) \cdot \frac{E(k)}{PX(k)|_t} \cdot X^*(k) \cdot G(k)$ "

and insert -- $H(k)|_{t+1} = H(k)_s + \mu(k) \cdot \frac{E(k)}{PX(k)|_t} \cdot X^*(k) \cdot G(k)$ --, therefor.

In Column 16, Line 57, in Claim 17, delete "pouter" and insert -- power --, therefor.

UNITED STATES PATENT AND TRADEMARK OFFICE
CERTIFICATE OF CORRECTION

PATENT NO. : 6,842,516 B1
APPLICATION NO. : 09/353484
DATED : January 11, 2005
INVENTOR(S) : Armbruster It is certified that error appears in the above-identified patent and that said Letters Patent is hereby corrected as shown below:

In Column 16, Line 60, in Claim 17, delete " $PI|_t = \beta \bullet Pin|_R + (1-\beta) \bullet PI|_{t-1}$ " and insert -- $PI|_t = \beta \bullet Pin|_t + (1-\beta) \bullet PI|_{t-1}$ --, therefor.

Signed and Sealed this

Eleventh Day of November, 2008

JON W. DUDAS
*Director of the United States Patent and Trademark Office*